United States Patent [19]

Baldi

[11] Patent Number: 5,028,385
[45] Date of Patent: Jul. 2, 1991

[54] TREATMENT OF METALS FOR COATING OR ACTIVATION

[76] Inventor: Alfonso L. Baldi, 3700 Boardwalk 702S, Sea Isle City, N.J. 08243

[21] Appl. No.: 433,119

[22] Filed: Nov. 8, 1989

Related U.S. Application Data

[63] Continuation-in-part of Ser. No. 335,240, Apr. 10, 1989, Pat. No. 4,957,421, and Ser. No. 205,387, Jun. 10, 1988, Pat. No. 4,895,609, and Ser. No. 289,595, Dec. 22, 1988, Pat. No. 4,965,095, and Ser. No. 182,718, Apr. 18, 1988, Pat. No. 4,970,114, and Ser. No. 96,368, Sep. 11, 1987, Pat. No. 4,880,483, and Ser. No. 28,741, Mar. 23, 1987, Pat. No. 4,927,798, and Ser. No. 643,781, Jul. 17, 1984, abandoned, and Ser. No. 830,767, Feb. 19, 1986, Pat. No. 4,799,979, and Ser. No. 685,910, Dec. 27, 1987, Pat. No. 4,820,362, and Ser. No. 538,541, Oct. 3, 1983, Pat. No. 4,830,931, and Ser. No. 531,544, Sep. 12, 1983, abandoned, and Ser. No. 507,174, Jun. 23, 1983, Pat. No. 4,694,036, and Ser. No. 417,214, Sep. 13, 1982, abandoned, and Ser. No. 359,212, Mar. 18, 1982, Pat. No. 4,443,557, and Ser. No. 281,405, Jul. 8, 1981, Pat. No. 4,708,913, and Ser. No. 242,350, Mar. 10, 1981, Pat. No. 4,464,430, and Ser. No. 230,333, Feb. 2, 1981, Pat. No. 4,347,267, and Ser. No. 172,671, Jul. 28, 1980, Pat. No. 4,435,481, said Ser. No. 685,910, is a continuation-in-part of Ser. No. 507,174, , and Ser. No. 281,405, , and Ser. No. 531,544, , said Ser. No. 830,767, is a continuation-in-part of Ser. No. 507,174, , and Ser. No. 281,405, , said Ser. No. 96,368, is a continuation-in-part of Ser. No. 281,405.

[51] Int. Cl.$^5$ .............................................. G22F 7/00
[52] U.S. Cl. ............................................. 419/8; 75/255; 75/743; 149/109.6; 419/30; 427/142; 502/301; 502/332
[58] Field of Search ............... 149/109.6; 419/8, 30; 75/743, 255; 427/142; 502/301, 332

[56] References Cited

U.S. PATENT DOCUMENTS

| 4,435,481 | 3/1984 | Baldi | 428/550 |
| 4,708,913 | 11/1987 | Baldi | 428/607 |
| 4,820,362 | 4/1989 | Baldi | 149/2 |
| 4,830,937 | 5/1989 | Baldi | 428/552 |
| 4,880,483 | 11/1989 | Baldi | 149/6 |

Primary Examiner—Stephen J. Lechert, Jr.
Attorney, Agent, or Firm—Connolly and Hutz

[57] ABSTRACT

Coating with high-melting metals can be simplified by alloying high-melting metal with sufficient aluminum to make low-melting alloy that is applied, bonded in place, and then subjected to the leaching out of some or most of the aluminum. The resulting surface is porous and will receive and hold top coatings. Leached surface can be pyrophoric and top coating can be exothermically combustible. Pyrophoric powder can also be coated on boron or carbon fibers or sintered with combustible particles. Carbon can be kept from contaminating diffusion-treated workpieces, by conducting diffusion treatment in retorts containing little or no carbon. Porosity can be created by subjecting workpiece to diffusion conditions in contact with depleting material such as powdered nickel or high-nickel aluminides or cobalt or high-cobalt aluminides. Aluminum particles can be electrophoretically deposited on foil and then diffused in. Leaching aluminum out with caustic is improved when a little $H_2O_2$ is present in the caustic. Subsequent treatment of the leached surface with weak acid further improves pyrophoricity, and folding of the pyrophoric member extends its pyrophorically-generated high-temperature dwell. Resin foil containing pyrophoric particles makes effective decoy. Re-conditioning of jet engine hot section airfoils is effected with a fluoridizing treatment that can add a little chromium to the fluoridized surfaces.

9 Claims, 2 Drawing Sheets

TREATMENT OF METALS FOR COATING OR ACTIVATION

This application is in part a continuation of parent applications

| | | |
|---|---|---|
| 335,240 | April 10, 1989 | (Patent 4957421) |
| 205,387 | June 10, 1988 | (Patent 4895609) |
| 289,595 | December 22, 1988 | (Patent 4965095) |
| 643,781 | July 17, 1984 | (subsequently abandoned) |
| 182,718 | April 18, 1988 | (Patent 4970114) |
| 96,368 | September 11, 1987 | (Patent 4,880,483) |
| 28,741 | March 23, 1987 | (Patent 4927798) |
| 830,767 | February 19, 1986 | Patent 4,799,979 |
| 685,910 | December 27, 1987 | Patent 4,820,362 |
| 538,541 | October 3, 1983 | Patent 4,830,931 |
| 531.544 | September 12, 1983 | Subsequently abandoned |
| 507,174 | June 23, 1983 | Patent 4,694,036 |
| 417,214 | September 13, 1982 | Subsequently abandoned |
| 359,212 | March 18, 1982 | Patent 4,443,557 |
| 281,405 | July 8, 1981 | Patent 4,708,913 |
| 242,350 | March 10, 1981 | Patent 4,464,430 |
| 230,333 | February 2, 1981 | Patent, 4,347,267 |
| 172,671 | July 28, 1980 | Patent 4,435,481 |

Ser. No. 685,910 is in its turn a continuation-in-part of Ser. No. 507,174, 281,405 and 531,544.

Ser. No. 830,767 is also a continuation-in-part of Ser. No. 507,174 and 281,405, while Ser. No. 96,368 is also a continuation-in-part of Ser. No. 281,405.

The present invention relates to the surface treatment of metals to activate them or prepare them for receiving coatings.

Among the objects of the present invention is the provision of novel methods for effecting activation and preparation.

Additional objects of the present invention include the provision of novel forms no activated metal.

the foregoing as well as further objects of the present invention will be more fully understood from the following description of several of its exemplifications, reference being made to the accompanying drawings in which:

The low-temperature diffusion aluminizing of steels to make a pyrophorically-activated product as described in the parent applications, is desirably combined with a diffusion boronizing that follows the aluminizing. The introduction of as little as 2% boron or even less, into such aluminized steels noticeably increases the pyrophoric heat evolution after the steel is subsequently activated by leaching out some of the aluminum and the thus-activated boronized steel exposed to the air.

Diffusion coating to catalytically activate the surface of a metal foam, such as nickel foam described in U.S. Pat. No. 3,111,396, is particularly desirable inasmuch as such a foam presents a very large metal surface and does not have the fragility of thin foil or screening. The diffusion-coating treatment generally introduces into the surface of the metal being activated a relatively high concentration of an embrittling metal such as aluminum, and fragile shapes such as foil and thin screening tend to break unless very carefully handled during this treatment.

The catalytic activation of platinum and other metals of the platinum family is preferably applied to very thin substrates in the interest of reducing the amount of such expensive metals needed and here also a metal foam shape as described in U.S. Pat. No. 3,111,396 is desirable.

To minimize having thin nickel foil rendered too fragile by the aluminizing, the diffusion step can be carried out at minimum temperature to reduce the depth of the diffusion case. Thus a 0.1 to 0.5 mil, or even a 1 mil, case can be provided on a nickel foil 1 or 2 mils thick by aluminizing at a temperature between 650 and 800 to 900° F. The foil is increased in thickness by the aluminizing, so that a heavy aluminizing of a one-mil thick foil can yield a product 2.5 to 3 or more mils thick with each face having an aluminized case and both cases together occupying about 2 to 2.6 mils of that thickness.

The fragility of thin foils when diffusion coated, can also be offset by having the metal of the foil in the form of a surface layer securely held on a carrier foil or sheet made of metal that does not have the objectionable fragility and can be subsequently separated from that surface layer. Thus a 5 mil thick aluminum sheet can have electroplated on one face a one mil thick layer of nickel or cobalt, using a preliminary flash coating of chromium or zinc to get the nickel or cobalt to adherently deposit. The final coated aluminum sheet is then subject to a 20-hour diffusion treatment at 750° to 850° F. in a hydrogen-bathed atmosphere to cause the aluminum to diffuse most of the way through the nickel or cobalt layer, after which the resulting product is subjected to caustic leaching to dissolve the aluminum. This leaves a catalytically active nickel or cobalt foil that contains a residual small content of diffused-in aluminum and holds itself together adequately for normal handling. Although pyrophoric, its catalytic activity is not as high as is available from a pack diffusion process without the aluminum carrier sheet, but it does a good job of catalyzing hydrogenation and other chemical reactions including ammonia oxidation and HCN formation. Of particular interest, a Ni or Co plating formed by electroplating in the above manner has a particularly low density thus limiting the amount of mass needed per unit volume of catalyst.

Both faces of the aluminum sheet can be given nickel or cobalt platings in which case the corners or edges of the plated sheet can be trimmed off to expose the aluminum substrate for leaching.

A very effective zinc flash for the foregoing plating sequence is obtained by a ½ to 1 minute dip of the cleaned aluminum sheet at room temperature in the following solution:

| | |
|---|---|
| NaOH | 525 grams |
| ZnO | 100 grams |
| $FeCl_3.6H_2O$ | 1 gram |
| $NaKC_4H_4O_6.4H_2O$ | 10 grams |
| Water | to make one liter |

Platinum and other catalytic metals can similarly be converted to catalytic foil, and other leachable metals like zinc can be used as the supporting foil in plate of aluminum. The supporting layer can also be made by spraying molten aluminum or zinc on a surface of the foil that is to be activated.

Palladium is best catalytically activated with zinc. A simple diffusion of about 1 to 30 milligrams of zinc per square centimeter of palladium surface, followed by leaching with strong, at least 10%, HCl in water at 95°

C., produces from a 1 mil thick foil a very effective catalyst. A typical pack diffusion treatment for palladium is the embedding of a 52-mesh palladium screen the wires of which are 4 mils thick, in a pack of 20% powdered zinc and 80% alumina, energized with ½% $NH_4Cl$, and heating for 4 hours at 600° F. in a hydrogen-bathed or argon-bathed atmosphere. This effects a zinc pick-up of 4 mg/cm², essentially all of which is leached out by 20% HCl in 10 minutes. The resulting screen is pyrophoric when exposed to air.

Zinc can be similarly diffused into titanium foil in a hydrogen-bathed or argon-bathed atmosphere from such a zinc-containing pack. As an example a 4 mil thick titanium foil is embedded in a pack having the following composition:

| | |
|---|---|
| 80 g | Zn |
| 16 g | Al |
| 305 g | $Al_2O_3$ |
| 4 g | $AlCl_3$ | and subjected to 10 hours of diffusion at 950° to 1000° F. The foil picks up about 3.5 milligrams of zinc per square centimeter. It is worthy of note that the titanium does not become seriously embrittled by such treatment, and can be bent around a ⅛-inch radius without cracking. The diffused-in zinc can be leached out with 20% boiling NaOH solution to leave a very active catalytic surface. Titanium activated this way still retains a little of the zinc and can be used as a conventional electrolysis electrode, or as a substitute for photosensitive electrodes such as described in the Augustynski et al paper in the Journal of the Electrochemical Society, Volume 124, No. 7, pages 1063–64 (1977).

Titanium activated by aluminizing and leaching can also be so used. Such titanium, still containing a little of the aluminum, can be heated in air or under other oxidizing conditions to convert some of its porous activation case to mixed titanium aluminum oxides and such a treated titanium makes a very effective photo-anode for photolysis of water containing a little NaOH. Even without the heat-treatment it is a very good photo-anode. Tin can also be diffused into titanium to provide similar results with and without the subsequent oxidation.

Whether the zincized, aluminized or stannized titanium is used as a photo-electrode, a platinum or platinized platinum or activated platinum counter-electrode is helpful. Activated platinum made as described in U.S. Pat. No. 4,154,705 is particularly helpful. A little ruthenium, such as 1 to 5% by weight can be incorporated in the titanium before it is aluminized, zincized or stannized, as a further improvement.

Instead of using separate electrodes for the photolysis, they can be provided in powdered form and mixed with each other as well as with other substances such as cadmium sulfide that also help with the photolysis.

Hydrogen peroxide appears to form during the foregoing photolysis and some exothermic heat is also generated and can be used to help keep the photolysis combination warm.

For some purposes, such as catalytic alkylation, it is helpful to have a catalytic tin surface. Inasmuch as tin is a very low melting metal, it is helpful to first diffuse the tin into a high-melting support such as nickel. By way of example an 80-mesh nickel gauze made of 4 mil thick wire, is embedded in the following pack:

| | |
|---|---|
| Tin powder | 73 grams |
| Nickel powder | 27 grams |
| Alumina | 300 grams |
| $NH_4Cl$ | 4 grams | which pack had been pre-fired at 1000° F. for 5 hours and then had its $NH_4Cl$ content replenished. Diffusion is conducted in hydrogen at 1400° F. for 5 hours to give a 20 milligram per square centimeter pick-up. The resulting tin-containing gauze after removal from the pack, is subjected to post diffusion by heating in hydrogen at 1600° to 1700° F. for 5 hours to leave the diffusion case about 1.3 mils thick. This product is now activated by a pack diffusion at 850° to 900° F. for 30 hours using a pack having 20% powdered aluminum, 80% powdered alumina, and energized with ½% anhydrous aluminum chloride. The aluminized product is then subjected to leaching with 10% NaOH solution to extract most of the diffused-in aluminum and leave an activated tin-nickel surface.

An activated copper-palladium surface can be prepared as by first electroplating a 1 mil thick layer of copper on a 1 mil thick palladium foil, heating the copper-palladium combination in hydrogen at 1050°–1100° F. for 12 hours to diffuse the copper deeply into the palladium, and then diffusion coating the resulting product under hydrogen in a pack containing 10% zinc, 90% alumina, and activated with ½% $NH_4Cl$. Ten hours of such treatment at 660°–690° F. produces a pick-up of about 7 milligrams of zinc per square centimeter of foil surface and a 0.7 mil thick case the surface stratum of which contains about 25% zinc. The final step in the activation is a leaching in 30% HCl for 3 minutes at about room temperature followed by 10 minutes more at about 212° F. in 15% HCl.

The pack diffusion to activate any of the catalysts of the present invention can be effected in one step or in multiple diffusion steps under different diffusion conditions to vary the distribution of the diffused-in metal. Regardless of how the diffusion is carried out, the pyrophoricity of the leached product can be entirely blocked by immersing the activated surface in an aqueous solution of a chromate such as an alkali metal, magnesium or ammonium chromate or chromic acid. A concentration of about 1% chromate ion is all that is needed to inhibit essentially all the otherwise intense pyrophoric activity of nickel for example, after only a few seconds contact. Smaller concentrations, as low as 0.1% chromate ion, will also be effective if kept in contact for longer times.

A catalyst so inhibited can be conveniently stored or shipped without being immersed in a protective liquid. Moreover the catalyst can subsequently be pyrophorically reactivated by merely treating it for about 2 minutes with 5% aqueous NaOH, preferably at 10° C. Rinsing away this treating liquid will then leave the catalyst with almost all of its original activity.

The chromate treatment does not significantly reduce the catalytic activity of the catalysts even though it kills the pyrophoricity. Indeed as shown in parent Ser. No. 531,444, such treatment can increase catalytic activity.

The catalytic activity withstands intense evacuation, although the activated surface gives off large quantities of hydrogen under the influence of the lowered pressure.

Activated nickel surfaces can also be modified by dipping for a few seconds in aqueous hydrogen peroxide. A three volume percent $H_2O_2$ solution modifies the surface and turns it black so that it is no longer pyrophoric. The modified surface is however still catalytic and will for example show a strong decrease in overvoltage when used as a cathode or anode in electrolyzing aqueous NaOH to generate gas. The activation of platinum or its alloys can be similarly modified by immersion in aqueous $H_2O_2$ or in aqueous HCl at least 20% strong.

A readily ignited metal such as titanium or magnesium in foil or write form can also be given a nickel coating, as by rolling, and the nickel coating then rendered pyrophoric. To ignite the ignitable metal the coating should be at least about 0.4 mil thick.

The pyrophoric metals, regardless of how they are produced, can be plated as by electrolytic coatings from alkaline cyanide baths of zinc, cadmium, silver, tin or copper, without significantly diminishing their pyrophoricity. Such coatings that are over about 0.2 mil thick will significantly reduce the pyrophoric action.

Platinum activated by the aluminum diffusion and leaching, still contains a significant amount of the aluminum, Even when heated to high temperatures, such as 1800° to 2300° F. for days of weeks, that residual aluminum remains in the outermost 0.3 mil or so of the metal. Platinum wire so treated shows greater useful life at very high temperatures, e.g. 1800° F. or higher. The increased life appears to be a characteristic of platinum that is alloyed with from about 0.5 to about 5% aluminum and has been heated to from 1800° F. to 2300° for at least a week. This improvement is most significant for very fragile wires such as those not over about 10 mils thick. Thus wires less than 4 mils thick when used as catalytic screens in gaseous reactions, are subjected to vibratory flexure by the flow of reacting gases, as well as attack by naturally occurring catalyst poisons swept along by those gases. The aluminum-containing platinum stands up much better in such service than aluminum-free platinum.

Platinum freshly activated by aluminum diffusion and leaching, has a characteristic fissured surface illustrated in U.S. Pat. No. 4,154,705 and it would not be expected that longer mechanical life could be obtained with such a surface. However after days of service at extremely high temperatures, the fissures become less pronounced, but the wire remains rough.

The presence of up to about 15% of other platinum metals alloyed with the platinum and the aluminum, does not significantly reduce the life-lengthening effect of the aluminum. Thus a platinum-rhodium alloy screen made of 3 mil thick wire containing 10% rhodium, that is further alloyed with 2% aluminum, also shows a markedly long service life at 1800° F. and higher. Similar results are obtained when iridium is substituted for some or all of the rhodium.

Instead of introducing the aluminum into the platinum by diffusion, it can more inexpensively be introduced by melt alloying, for example at the same time rhodium is alloyed with the platinum. Wire drawn from the resulting alloy does not have the very high catalytic activity of platinum activated by surface diffusion and leaching as described above, but it is still strongly catalytic and it also has the long service life.

When the aluminum is introduced into a platinum screen by low-temperature diffusion, that is diffusion below about 900° F., the aluminum introduction is generally very slight or completely absent at locations such as wire crossover points where one wire touches another and at least partially blocks the diffusing action. Although little or no aluminum is located at those points, the resulting screen performs even better than one which has been subjected to heavy aluminizing that reaches 100% of its surface. A similar improvement can be obtained on a heavily aluminized screen by following the caustic leach with an acid treatment, HCl for example, that leaches out extra amounts of aluminum.

The improved service life can be obtained when the aluminum-carrying platinum is subjected to the preliminary heat treatment in air, in a vacuum, in nitrogen, hydrogen or in catalytically reacting gases. It appears that 1800° to 2300° F. temperature for the minimum of one week is the key to long life.

Pyrophorically activated nickel and iron also retain some of the aluminum or zinc or the like used to activate them, even though these activating metals are leached out with strong hot aqueous caustic for 12 hours or more. When such leached pyrophoric products are dipped in 1 to 5% aqueous $H_2O_2$ for about ¼ to about 1 hour, their pyrophoricity is sharply reduced or entirely eliminated. Notwithstanding such reduction the products are still strongly catalytic. A nickel screen having forty 10 mil wires per inch, and diffusion aluminized at 950° F. for 16 hours followed by 2 hours of leaching in 20% aqueous NaOH at 180° F. with a final 30 minute dip in 2% aqueous $H_2O_2$, develops an activated case about 1.6 mils thick and shows a very low overvoltage as a cathode in electrolyzing water containing a little dissolved KOH. Although the freshly leached screen is not pyrophoric, after two to four weeks electrolyzing the water, it tends to become pyrophoric. At this point a three-hour dip in 160° F. tap water will eliminate the pyrophoricity.

Although the screen pyrophoricity tends to increase while it is used as an electrolysis electrode, its catalytic effectiveness tends to very gradually drop during such use. After several years of such use, the screens are desirably re-activated by subjecting them to another aluminizing treatment followed by another leaching out of aluminum. The activated surface can be removed beforehand by prolonged exposure to dilute aqueous mineral acid.

Diffusion aluminizing also protects workpiece against high-temperature corrosive attack, as in jet engines, particularly with the help of a top coating as in Example I of U.S. Pat. No. 3,948,689, or Example III of U.S. Pat. No. 4,141,760, or in parent Ser. No. 417,214, or in Canadian Patent No. 779,173. Particularly good results are obtained with 0.1 mil thick coatings from suspensions of 1 to 3 micron ground aluminum particles in the aqueous magnesium phosphate-chromate formulations of the Canadian patent. Some very small particle sizes are more effective than the 5 to 10 micron size suggested in the patent. The aqueous suspension can also contain colloidal alumina or silica instead of applying such colloidal material as a preliminary layer in the manner described in the U.S. patents. Whichever modification is used, the top coating should be baked at about 650° to 700° F. for at least about 30 minutes, to provide still better protection. It can be alternatively or additionally subjected to barrel burnishing with steel, ceramic, or plastic burnishing media. The top coating can also be applied as multiple layers.

The aluminizing of the present invention can also be used to prepare aluminized steel, iron, nickel or other substrates for conversion to Raney-type activated metals, as described in U.S. Pat. No. 4,154,705. Both self-supporting substrates and powdered substrates can be so activated and such activation of powders is described in parent Ser. No. 507,174. This type of treatment provides the greatest degree of activation for foils or other self-supporting substrates when the aluminizing is effected at the lowest temperatures —below 1000° F. — and at such low temperatures energizers such as inexpensive ammonium halides give undesirable diffusion cases. Aluminum halide activators give better results, as does water-insoluble $CrCl_3$.

The pyrophoric effects of the Raney-type activated metals is further improved by diffusing boron into the surface being activated. This is shown in the following example:

EXAMPLE 1

Three-hundred grams of powdered 325 mesh $FeAl_2$ is thoroughly mixed with 10 grams powdered boron and 6 grams of powdered $NaBF_4$. The mixture is placed in a carbon steel retort which is then fitted into a tube furnace, and heated while a flushing gas is passed through the tube as in U.S. Pat. No. 3,903,338. A heat of 1800 deg. F. held there for 1½ hours under hydrogen, introduces about 7% boron into the $FeAl_2$ powder, based on its iron content.

The retort contents are partially sintered together as a result of the diffusion heat, but can be fairly easily removed from the retort after banging the outside of the retort with hammers or mallets. Crushing and/or grinding readily reduces the mass to very small particle size. Then on leaching aluminum out of the resulting product mass as by a 60-minute treatment in 15-16% aqueous NaOH that is cooled in keep it below 120° F., followed by washing, the activated particles remaining are quite pyrophoric and on exposure to air heat up to temperature of about 1000° F. Higher and lower leaching concentrations and temperatures can also be used, but are less desirable.

Longer diffusion boronizing provides, after leaching, an activated iron-aluminum-boron alloy powder containing as much as 30% boron based on the weight of its iron, and which upon exposure to air heats up to over 1200° F. Boron contents greater than about 30% provide decreasing heat-up and at about 40% leave the leached powder non-pyrophoric. It is preferred that the boron penetrate through the entire thickness of each powder particle and that each particle have a uniform composition throughout its thickness.

Similar results are obtained when $FeAl_3$ powder is used in place of the $FeAl_2$, when alloys of intermediate proportions are used, and when the corresponding nickel-aluminum alloys are used. Some of the alloys are not as brittle, and therefore not as easily grindable as others. If the iron-aluminum alloy powder particles being boronized are over about 1 millimeter in size, the boronizing treatment times should be substantially lengthened to make the boron penetration complete. Other boronhaldies such as ammonium fluoborate, $BBr_3$ and $BI_3$ can be used as energizers. In general the energizer content of the pack should be from about 1 to about 3% by weight, and the diffusion temperature at least about 1400° F.

By not using an inert refractory diluent in the boronizing pack, it becomes unnecessary to later separate such diluent from the boronized powder.

The foregoing boronizing of self-supporting substrates such as foils requires much more care and should be conducted with inert refractory diluent in the pack. Thus, conducting the same boronizing on lengths of one-mil thick aluminized iron foil is awkward because such foil is extremely brittle and difficult to handle. The following is a preferred example.

EXAMPLE 2

Such boronizing can be satisfactorily effected in the following powder pack:

| 200 grams | powdered alumina |
|---|---|
| 10 grams | powdered boron |
| 5 grams | sodium or ammonium fluoborate, | at 950° F. for 18 hours, or at 1050° F. for 3 hours, in a hydrogen-bathed atmosphere. The boron then penetrates about half way through the aluminized case.

Aluminum loss to the boron in the pack also takes place. The aluminizing of an iron-boron alloy in an attempt to introduce sufficient aluminum to give a pyrophoric product after leaching, causes excessive loss of boron from the substrate to the pack.

The activated powders containing boron, or even free of boron, are stored out of contact with air or oxygen to preserve their pyrophoricity. Water is not a suitable preserving liquid for the activated boron-containing powders. Acetone preserves them for at least three weeks, as does an azeotropic mixture of trifluorotrichloro ethane with methylene chloride, described in U.S. Pat. No. 2,999,817. Ordinary fluoro-chloro ethanes and methanes that are normally used as refrigerants or propellants are also suitable and they can be used by themselves or mixed with each other or with acetone. Mixtures of the activated powders with preserving liquids that are also propellants, are particularly desirable in that they can be packed in an aerosol-type container from which they are readily discharged to provide a cloud of pyrophorically oxidizing particles.

Titanium can also be aluminized and/or boronized by the same type of treatments, to make it more resistant to corrosive attack. For this purpose the aluminum is not leached out. It is also very desirable to diffusion coat titanium in the absence of hydrogen and in the complete or substantially complete absence of conventional halide activators like $AlCl_3$ and $NH_4Cl$. Thus engine compressor blades made to Ti6A14V can be embedded in a pack of 20% Al-Si alloy powder containing 12% silicon, and 80% alumina, completely free of energizer, and at 1300° F. for 14 hours under argon, acquires a protective aluminide case 0.5 to 1 mil thick. Using pure aluminum instead of the Al-Si alloy reduces the case thickness by about half.

Adding ¼% $AlCl_3$ or $NH_4Cl$ energizer to the pack causes the titanium substrate to be significantly embrittled. However the aluminizing can be speeded by using a pack that had been pre-fired with such a halide energizer for a time long enough to drive out essentially all the energizer —at least one to two hours at 700° F. or higher. It appears that some energizer remains or some change is caused, to make the pre-fired pack much more effective in aluminizing the titanium. In any event the resulting aluminizing produces thicker cases, and can be readily effected at temperatures as low as 1000° F. or in times as short as 5 hours.

The addition to the pack of about 1/10% of a titanium halide such as $TiCl_2$, preferably sealed in a polyethylene tube so as to be protected against exposure to the atmosphere, is also helpful to speed up the diffusion coating. The polyethylene tube melts before the pack reaches diffusion temperature, releasing its contents.

The aluminized titanium compressor blades can then be boronized instead of or before applying a top coating as described above in connection with the Canadian patent. A suitable boronizing pack for this purpose is the diluent-containing pack of Example 2, using ammonium fluoborate as the energizer and with added titanium powder in an amount about half the amount of boron powder, by weight. A 0.3 mil boronized case is thus formed at 1075° F. for 14 hours in argon. The titanium powder helps keep the titanium substrate from being attacked by the halide in the pack, and can also be added to the pack used for aluminizing titanium. It can also be omitted, particularly when only a thin diffusion coating is desired. When the powdered titanium is used, it can range from about 1/5 the boron content to about equal the boron content by weight. Boron being a very high melting material, it can be used with little or no refractory diluent, particularly at diffusion temperatures low enough to keep the workpiece surfaces from reaching a sintering condition. On the other hand the boron content of a boronizing pack can be as low as 2%, although at least 4% is preferred. To be sure that no sintering takes place an inert refractory diluent like $Al_2O_3$, kaolin or MgO can be present in the pack in a concentration of at least 30%.

The re-use of packs containing sodium fluoborate energizer can be complicated by the gradual build-up of sodium fluoride with each use. This problem does not appear to arise when ammonium fluoborate is the energizer.

For some purpose it is helpful to have pyrophoric decoy pieces that when discharged into the air from a rapidly moving aircraft, do not immediately slow down and stop their discharge movement. To this end the pieces can be contained in a wire netting that permits them to spread out to only about 1 meter when discharged. Alternatively or additionally, the decoy pieces can be made so that their air resistance is small and inertia high. Thus the carrier web can be tantalum, silver or lead foil as much as ¾ mil thick, and only about 1 square centimeter discs. Silver webs also contribute very good electrical conductivity that provides the pieces with an electrical dipole that helps decoy against radar signals. Copper has a similar dipole effect.

The decoying action can be modified by arranging for a succession of decoy charges to be expelled by a moving aircraft in 20 to 30 second intervals, for example. This appears to a heat-seeking missile as a series of hot clouds that move with the aircraft, and thus becomes a more attractive decoy target.

The pyrophoric behavior of activated iron particles is different when they are prepared in different ways. The most vigorous behavior is obtained when the particles and the precursor aluminides from which they are made, are kept from melting during the preparation. The following is an example:

EXAMPLE 3

40 grams minus 325 mesh iron powder are mixed with 60 grams similarly sized aluminum powder and 1 gram anhydrous aluminum chloride powder, and the mixture placed in a steel retort, the retort loosely covered and placed in a larger retort through which a stream of argon flushes. The retort assembly is then inserted in a furnace, heated to 1200° F. and kept there for 1½ hours. During the initial heat-up, a stream of hydrogen is substituted for the stream of argon. After cooldown the powder particles have sintered together to a large degree, and the resulting masses are ground, as with a chopper blade such as used in a micro-mill type grinder, to very fine particle size, for example 325 mesh. These particles can be screened out, if desired, and constitute particles that can be somewhat larger in size than the original particles. These aluminized particles can now be subjected to a caustic leach treatment to produce highly pyrophoric iron powder the particles of which are about the same overall size as the aluminized particles. The grinding can be controlled to provide activated particles of larger or smaller size.

To reduce the tendency for the particles to sinter together during the diffusion coating, the diffusion temperature and/or time can be lowered to as low as about 800° F. to 900° F. and/or inert refractory particles such as alumina powder can be mixed with the iron and aluminum powders. After such a mixture has completed its diffusion coating treatment or the leaching treatment, the inert alumina can be separated out magnetically. The leached iron particles are magnetic whereas the alumina particles are nonmagnetic, so that pouring a stream of the mixtures through a magnetic field causes the iron particles to be deflected away from the alumina particles. There may be some tendency for fine alumina or other refractory particles to physically adhere to the diffusion-coated iron particles, in which event the diffusion-coated mixture can be forcefully agitated in water preferably containing a little surface active agent to wash the fine alumina or the like off the heavier iron particles and permit those heavier particles to settle out.

Powdered pyrophoric metal or powdered precursor alloys can also be separated from inert diluents or other ingredients in diffusion coating packs by having different sizes for the particles to be separated and sieving the mixture to effect the separation. Thus cobalt or iron balls at least about 20 mils in diameter can be diffusion coated in a pack whose particles are all smaller than 2 mils thick.

The pyrophoric particles can be used to generate a hot cloud, as for example to decoy heat-seeking missiles. Thus the pyrophoric particles produced according to Example 3 can be rinsed with water then with acetone and packed under argon in a simple container or in a spray can, and about 100 grams of such powder projected into the air. These particles promptly heat up and oxidize. The resulting cloud of particles rises as a result of the heating. It is only after several minutes that the oxidized particles settle down to the ground.

The pyrophoric particles are conveniently discharged to form the desired cloud, by loading them into a shotgun shell in place of the shot and the shot-dispersing gunpowder. A relatively short 12-gauge paper shell can thus be packed with about 50 grams of the powder sealed airtight in a plastic enclosure around which the shell is crimped. The usual primer charge will be enough, when detonated, to expel the powder and create the desired cloud.

Larger quantities, up to a pound or more, can be poured into a valved pressure-resistant container which is then pressurized to about 200 to 600 pounds per square inch gauge with argon. Upon opening the valve, the powder contents are propelled out with the argon.

A hot cloud of rising particles is also produced with pyrophoric iron-aluminum alloy particles obtained by leaching powdered $FeAl_2$ or $FeAl_3$, both of which are available commercially as powdered Raney metal. Such commercial powders are obtained by grinding a solidified melt of iron and aluminum having these metal in the desired proportions. Powders with particles sized to pass 100 or 250 mesh are thus available. If desired, they can be ground down to particle size of less than 60 microns or even less than 30 microns. Particles as small as 2 to 3 microns tend to become passivated and are not very desirable; particles from about 5 to about 10 microns in size are quite suitable.

Modifying example 3 by using a particle size of about 30 to 100 microns for the iron powder and for the aluminum powder and reducing the diffusion time to one hour after it reaches 900° F., yields iron-aluminum alloy particles not heavily sintered together; a light crushing in a mortar and pestle yields a powder that can be somewhat coarser. A one-hour leaching of that powder in 17% aqueous NaOH by weight while keeping the leaching temperature no higher than 110° F. leaves a pyrophoric powder that when discharged produces a hot cloud that does not rise much before eventually settling out.

An alloy in which before leaching the aluminum content is at least about 40% by weight should be used to make the desired cloud, but an aluminum content of at least about 50% by weight is preferred. Cooling of the leaching reaction may be required, depending on the quantity of reactants and the volume of the leach solution. Because of the fineness of the particles, the entire leaching step takes about one hour or less; shorter leaching times (e.g., 30 minutes) give the best results. Caustic potash can be used in place of caustic soda under the same conditions. The addition to the caustic of stannite or stannate to the leaching caustic, as described in U.S. Pat. No. 4,435,481, is desirable.

The foregoing leaching leaves the leached particles with only a small aluminum content and highly pyrophoric. More vigorous leaching leaves a smaller aluminum content in the leached particles, but appears to attack the active iron sites and also leaves them somewhat less pyrophoric and less effective.

Pyrophoricity is readily measured by exposing a 25 to 35 milligram sample of the activated powder to air and using a two-mil platinum-platinum/rhodium wire thermocouple to measure the temperature rise during the exposure. A temperature of 600° F. should be reached, but preferred temperatures are as high as 1100° F. or higher.

Substituting nickel for the iron in the diffusion coated particles, or using commercial Raney nickel powder, gives somewhat better results in producing a rising cloud of pyrophorically heated particles. Thus, nickel-aluminum alloys containing as little as about 35% aluminum before leaching can be very effectively used.

Where, before leaching, the pyrophoric particles are made by diffusing aluminum into iron or nickel, it is important to conduct the diffusing operation at relatively low temperatures, such as below 1200° F. and preferably below 1000° F. Even at temperatures as low as 850° F. the time at temperature can be as short as about 45 minutes when a diffusion activator such as $AlCl_3$ is used.

The alloy particles can also contain other ingredients such as boron, titanium, carbon, zirconium and magnesium that help generate heat. Excluding the aluminum, the content of pyrophoric metal in the leached alloy should be at least about half by weight in order to have enough pyrophoricity to cause the remaining ingredients to react and generate their reaction heat.

The pyrophoric reaction can be stretched out by interfering with the access of oxygen to the pyrophoric surface. Thus, light coatings of colloidal silica or alumina as described in U.S. Pat. No. 4,349,612 can be applied to the particles. Also, leaching in caustic that contains sodium or potassium silicate leaves a residual silicate film if rinsing is incomplete or by rinsing thoroughly and then dipping into a dilute solution of silicate preferably having a 3-to-5 $SiO_2$ to 1 $Na_2O$ ratio.

The pyrophoric particles used to make the hot cloud can be mixed with other materials that increase or decrease the heat generation and/or vertical cloud movement. Thus the activity of the pyrophoric particles can be reduced as by too vigorous leaching or by particularly light leaching, and the sizes of the pyrophoric particles can be increased to 100 or more microns to keep them from rising much in the hot cloud. Alloying the particles with other ingredients such as silicon or chromium that are not rendered pyrophoric, also reduces the upward movement of the cloud they generate after activation.

Alternatively, the pyrophoric particles can be mixed with non-pyrophoric particles such as unactivated iron powder or carbon powder which act as diluents and also burn.

Another example is

EXAMPLE 4

Pack Composition

| | |
|---|---|
| 210 g | minus 325 Al powder |
| 210 g | minus 325 Fe powder |
| 4 g | $AlCl_3$ |

The above is mixed and placed in a plain steel retort filled with an internal thermocouple. The retort so loaded is placed in a furnace and fired at 1000° F. under Hydrogen. When the internal temperature reached about 400° F. an exothermic reaction occurred as revealed by an instantaneous surge of the internal temperature to 1735° F. The retort was maintained in the 1000° F. furnace for two hours. It was then cooled under Hydrogen and purged with Argon after reaching room temperature.

The pack in the retort was hard but it could be unloaded and ground with mortar and pestle to pass through a minus 100 mesh sieve. The yield was 96%. 200 g of the sieved $FeAl_2$ product was gradually added to a solution of 267 g NaOH+7 g $SnCl_2$ $0.2H_2O$ in 2 liters of water at 140°-160° F. The resulting leaching was carried out under an argon atmosphere to insure no oxidation of the activated iron particles. The activated iron now contains less than about 2% Al, and it was rinsed in water to pH 8, then rinsed in acetone to remove the water, and dried in argon.

The dried activated iron was very pyrophoric. Similarly activated iron particles prepared by leaching an alloy having the same proportion but supplied as a solidified melt from commercial sources, was far less pyrophoric. Dispersing of the powders by throwing out into the air 50 grams of the respective activated products resulted in immediate incandescence of essentially all unmelted particles, but only delayed or no incandescence from the particles that had a history of melting. It was also noted that the latter particles tended to become passivated and generated less total heat. Subjecting the respective particles to the mild acid after-treatment of parent Ser. No. 28,741 further increases their heat generation and reduces their response time.

Use by or against fast-moving aircraft can be greatly assisted by the immediate incandescence. However it is sometimes desirable to have immediate heat-up of the particles, but with the heat-up temperature sufficiently low that no incandescence is visible. To this end the particles are diluted with inactive powder or provided with inactive coatings that delay but do not completely block access to oxygen. Thus the addition to the very reactive particles of about 10 to 20% of minus 325 mesh $Al_2O_3$ sharply reduces the incandescence of the mixture. Other inert oxides such as MgO, $TiO_2$ and $ZrO_2$ have a similar effect. White additives are preferred because they also lighten up the dark-colored smoke that is produced by the pyrophoric reaction.

Alternatively the iron being activated can be alloyed with non-pyrophoric metal such as chromium or silicon, and only about 5 to 20% of such alloying can completely prevent incandescence.

Incandescence-inhibiting coatings can be of any type including water-soluble and water-dispersible silicates and borosilicates. By way of example 10 grams of the highly active iron particles can be stirred into 100 cc of a 10% aqueous solution of a soluble borosilicate containing 35% $B_2O_3$ and 65% $SiO_2$, and filtered off after 30 minutes standing, to show essentially no incandescence after drying.

The pyrophoric product is also a very effective catalyst for different kinds of chemical and electrochemical reaction, such as electrolysis of water with very low over-voltages, ammonia oxidation, Co oxidation and NOX removal. This catalytic quality remains essentially unaffected after the pyrophoric product is permitted to undergo its pyrophoric reaction with air. The pyrophoric product can also be stabilized by exposure to small concentrations of air under conditions that keep it from getting warm enough to rapidly react, as described in parent Ser. No. 685,910.

As shown in parent Ser. No. 643,781, the foregoing decoy elements can be produced in a continuous operation, and the contents of that application are hereby incorporated herein as though fully set out. Modified techniques for producing decoy elements and for producing them on a continuous basis are disclosed in parent Ser. No. 205,387 and Ser. No. 335,240.

Regardless of which technique is used to produce the pyrophoric elements, their pyrophoric heat generation can be increased by subjecting them to a mild acid after-treatment as described in parent Ser. No. 28,741.

Of particular significance is the internal coating of hollow jet engine blades made of superalloys such as B-1900 or other nickel base superalloys, with the blades suspended in a retort having a layer of activated diffusion coating powder on the retort floor under the blades. Thus Example 4 of parent Ser. No. 230,333 can be modified by not using the slurry for coating the interior of the blades there described, and instead vibrating into the cleaned and dried blade interiors a dry powder pack composed of, by weight,

| | |
|---|---|
| 45% | chromium powder the particles of which are less than 20 microns in size |
| 10% | aluminum powder minus 200 mesh |
| 45% | calcined alumina minus 200 mesh | to which mixture ½% fine $NH_4Cl$ powder is added. The resulting pack was pre-fired at 1950° F. for 10 hours, and then fresh $NH_4Cl$ was added and the pack sifted through a 60-mesh screen to make sure no coarse particles are present. The material not passing through the screen was discarded.

The blades with the sifted pack filling their interiors are then mounted in one of the retorts illustrated in Ser. No. 230,333 and the retort floor covered with a ¾ inch thick layer of a chromium-containing aluminizing pack such as one consisting of, by weight, 45% chromium powder, 15% aluminum powder, and 40% alumina powder, activated with ½% ammonium chloride or ammonium fluoride or bifluoride, or a mixture of these. Alternatively the aluminizing pack on the floor and/or in the blade interior, can be a simple aluminizing pack such as one consisting of a correspondingly activated mixture, by weight, of 10% aluminum powder and 90% alumina powder.

The retort is first heated, with a hydrogen flush, to 1900°–1950° F. where it is held for 9 hours, after which the heating is terminated and the retorts cooled. The interiors of the cooled blades are cleaned out by blasts of high pressure air, leaving blades with about a 3 mil internal aluminized case of very good uniformity, and an external case of practically the same or slightly lesser thickness. The external case tends to be a bit thinner at those portions of the blade remote from the retort floor, as compared to the blade portions close to the floor.

The foregoing simultaneous internal and external coating technique is particularly suitable for workpieces having interiors accessible only through a passageway less than about 5 millimeters, or even less than about 2 millimeters wide. For passageways only about 0.1 millimeters wide, or narrower, the diffusion coating pack powder particles should be of extremely small size, as for example 10 to 20 microns. Using particles in the form of microspheres is also helpful, particularly in the smaller sizes, because such particles pour extremely readily. Other forms of pourable or fluent particles are also desirable.

Similarly effective diffusion coatings are formed with other superalloys, including cobalt-base superalloys, and even with other alloys and steels such as high-temperature steels. The layers on the retort floor can be any of those described in Ser. No. 230,333, and the packs loaded into the interiors of hollow blades or other hollow objects being coated, can also be selected from those that deposit the desired internal coating. Inasmuch as the objects being coated are not embedded in a pack, the labor involved is much reduced and heat-up and cool-down times also much reduces, as compared to the coatings described in U.S. Pat. No. 3,936,539.

A modified form of aluminum diffusion and leaching can also be used for applying coatings. In this modification there is first prepared an alloy of aluminum containing relatively small amounts of other metals to be coated onto a substrate. This pre-prepared alloy contains sufficient aluminum to bring its melting point down to 1800° F. or below, preferably 1400° F. or below. It can then be readily flame-sprayed on a workpiece, or the workpiece can be dip-coated in the molten alloy, and if desired the resulting coated workpiece heated in a protective atmosphere to improve the bonding. Where a protective atmosphere is used, it can be that of a diffusion coating activator like $NH_4Cl$ or $NH_4F$ or $NF_4HF_2$.

After the coating is completed, the coated workpiece is then dropped into a leaching bath that dissolves out most of the aluminum from the coating. Where some specific amount of aluminum is desired to be present in the coating after the leaching is completed, the leaching is terminated before the residual aluminum content drops too low.

After the completion of the leaching the workpiece has the desired coating, but the coating is in a microporous condition due to the voids introduced where the aluminum has been leached out. In such condition the coating is particularly receptive to receiving and anchoring top layers such as ceramic thermal barrier applied over jet engine vanes and blades.

A particularly desirable coating is the McrAlY and McrAlZr type coatings described in U.S. Pat. No. 4,005,989 and in the U.S. Department of Energy report DOE/NASA/259-26 NASA TM81685 dated February 1981. Although these coatings contain only about 12 to about 15% aluminum by weight, a good aluminum-rich starting alloy for dip-coating or flame-spraying contains about 40 to 50% aluminum with the remaining alloying ingredients in the desired final proportions. About 3 hours of leaching in 20% aqueous NaOH at 140° F. subsequently removes essentially all the excess aluminum. The MCrAlY type coatings should not be leached too vigorously because the yttrium tends to be leached out by strong hot caustic.

After the leaching the leached produced are rinsed and then top-coated with a mixture of extremely fine particles of $ZrO_2$ and $Y_2O_3$ as described in the above-cited Department of Energy report and the references cited therein. Such top-coatings generally have the $ZrO_2$ and $Y_2O_3$ in a molar ratio of from about 1:8 to about 1:12. Such mixtures can be slurried in water and the leached workpiece dipped in the slurry. The workpiece is now fired at about 2000° F. for a few minutes to secure the oxides in place, and the dipping and firing repeated to form an effective thermal barrier that can be about 5 to about 15 mils thick.

The "M" of the MCrAlYT and MCrAlZr can be nickel, cobalt, iron or mixtures of any two or all three of these metals.

A thermal barrier is not needed when the diffusion coating is used for NOX removal and contains vanadium or other NOX-removing catalysts.

Other thermal barrier or top coatings can be substituted for or added to the $ZrO_2$ and $Y_2O_3$ mixtures, although ceramic barriers are preferred. Typical top coatings are shown in U.S. Pat. No. 4,260,654.

Any of these top coatings and thermal barriers can be applied over other porous undercoatings such as the porous nickel and platinum coatings described in U.S. Pat. No. 4,154,705. The nickel and platinum can themselves be applied as an alloy with aluminum or other selectively removable metal, and the selectively removable metal then removed as by leaching.

Alternatively a superalloy jet engine blade can be flame-sprayed with an aluminum-rich Al-Pt alloy, after which excess aluminum is leached out and the final porous surface heat-treated at a temperature high enough, e.g., 2000° F., in a diffusion atmosphere to cause the surface metal to diffuse into and thus fill the pores.

A further modification is the low-temperature diffusion of an aluminum coating into the surface of a substrate such as a superalloy jet engine blade, followed by leaching to render the aluminized surface porous, after which a solution of a thermally decomposable compound of a desired metal like platinum is absorbed into that porous surface and dried. The resulting material is now subjected to a diffusion treatment with or without an aluminizing pack, to liberate the platinum or other free metal, fill the pores, and blend the surface metals.

Cobalt also provides a suitable porous undercoat when applied and then rendered porous. While iron is quite similar in its characteristics, the leaching of iron-aluminum undercoating should be quite limited inasmuch as heavy leaching leaves the porous iron residue poorly adherent to the substrate. Platinum, nickel and cobalt give very good results when their porous stratum is from about ½ to about 2 to 3 mils thick, but porous iron provided in this way should not be over 1 to 2 mils thick. The aluminum alloy thickness on which the porous strata are formed should be about one or two mils thicker than the final porous layer.

The porous nickel, iron, platinum, cobalt and silver surfaces described in U.S. Pat. No. 3,637,437 can also be used to better anchor top coatings, whether applied to the substrates disclosed in that patent or on other metallic or non-metallic substrates.

The foregoing leaching can leave the product with a pyrophoxic porous stratum that spontaneously reacts with oxygen in the air. The nickel, cobalt and iron is covered by an oxide film as a result of such reaction, but this oxide film does not completely block the pores over which it forms and does not interfere with the application of top coatings. Where the substrates carrying the undercoatings are extremely thin themselves, the reaction with oxygen can cause a substantial temperature rise, particularly in the case of porous nickel.

The foregoing porous undercoatings of platinum, nickel, cobalt, iron, and even silver can also be used to better anchor an McrAlY or MCrAlZr top coating which can then be applied by the standard plasma coating technique, and if desired can also be further protected by an overlying thermal barrier layer.

As described in the parent applications, the pyrophoric action of pyrophoric members can be increased by placing in intimate contact with the member, a solid or liquid that undergoes an exothermic reaction when heated. Metals like magnesium and titanium, and even boron can thus be adhered to a pyrophoric foil as by placing a magnesium ribbon over an activated foil and passing the assembly between a pair of pressure rollers. Powdered materials such as magnesium, titanium, manganese, zirconium, carbon, aluminum or boron can be dispersed in a volatile liquid and the dispersion applied to an activated member and dried. Commercially available boron powder is very effective when dispersed in an alcohol such as ethanol.

Such pyrophoric combinations need not be in the form of very thin coated foils, and can take other forms. Thus a 5-mil thick felt of boron or carbon fibers or ordinary paper or cotton cloth can be coated on one or both sides with a paste of pyrophorically activated iron or nickel powder, and the coated felt subjected to a drying and if desired a sintering treatment to form a self-supporting sheet in which the pyrophoric particles are embedded in the inter-fiber spaces. A boron felt weighing about 0.1 gram per square centimeter of gross surface (as measured with a ruler), carrying 0.2 gram pyrophoric iron powder per square centimeter of gross surface, generates a very large amount of heat when exposed to the atmosphere. Ordinary steel wool also makes a very effective porous substrate for impregnation.

The activated iron powder is readily prepared by activating the surface of an iron foil or sheet and scraping off the activated layer. Raney iron can also be used. Activated nickel powder can be prepared the same way but the scraping is much more difficult and it is accordingly preferred to use Raney nickel powder or to leach powdered NiAl$_3$ with alkali.

Instead of making a pyrophoric combination by starting with a sheet of felted fibers, the starting material can be a porous sheet or disc prepared as by a sintering operation so as to contain at least about 20% voids. The voids are then impregnated with pyrophoric or combustible particles as by merely applying to the sintered sheet or disc a slurry of the particles suspended in water or other volatile liquid. The presence of 1 to 5% resin binder in the liquid, based on the weight of the suspended particles, helps retain them in place after they are impregnated into the pores. Such particles are preferably about 1 mil or less in thickness, and the pores at least about 3 times the particle size. The porous sheet or disc can thus be sintered from particles at least about 10 mils in diameter so as to contain such large voids.

Alternatively the pyrophorically activated particles can be mixed with the non-pyrophoric combustible particles and the mixture thus sintered into the desired finished structure. In this modification powdered 100 mesh magnesium is for example mixed with one-half to twice its weight of minus 180 mesh pyrophoric iron or nickel powder, and the mixture first compacted under argon at 10,000 pounds per square inch into a disc about 5 mils thick, and then sintered at about 600° C. Only about 30 minutes at that temperature is sufficient. Higher temperatures can be used with other materials, but may cause excessive thermal deterioration of the pyropyoric particles and should be limited to shorter times.

Other particles such as of boron, zirconium and the like can be included in the mixture being sintered, even though these other particles do not significantly sinter together under the sintering conditions, so long as they are not in such large proportions as to prevent the sintering of the sinterable particles. For the greatest thermal output a high boron content is desired, at least 20% by weight, and some easily ignited metal such as magnesium, titanium or zirconium can be used to be more readily ignited by the pyrophoric particles. Because the non-pyrophoric particles act as heat sinks, the content of pyrophoric particles should be at least ⅓ by weight in order to reach the necessary ignition temperature, at least in one portion of the sintered member. Pyrophoric nickel particles are somewhat more effective then pyrophoric iron particles in igniting non-pyrophoric particles.

The compacted and/or sintered mixtures can be made using pyrophoricity-developing particles that are not leached until the compacting and/or sintering is completed, but the products produced this way are less effective.

The non-pyrophoric coating ignited by a pyrophoric substrate can be of the type that exothermally reacts in the absence of atmospheric oxygen. Thus the coating can be picric acid or a thermite mixture of finely divided aluminum and iron oxide powders, or ammonium dichromate, or gunpowder or a mixture of finely divided iron or boron with sodium nitrate or chlorate. Such a coating only about 1 or 2 mils thick on a pyrophorically activated iron or nickel foil about 2 mils thick, is ignited by the pyrophoric action when the coated foil is discharged into the thin air at altitudes of about 30,000 to 50,000 feet, and then generates supplemental heat more effectively than the pyrophoric action at those altitudes.

A little resin binder may be used to help hold such exothermic coatings in place, although soluble materials can be adherently deposited from solution in a vaporizable solvent such as methanol or water, and the solvent then vaporized off.

The foregoing exothermic coatings that react in the absence of atmospheric oxygen, can also be effectively applied to the above-discussed discs.

The sintered products can have their pyrophoricity blocked by the same coatings or atmospheres used to preserve pyrophoric foils. Moreover by combining two different types of coatings, enhanced blocking effects are obtainable. Thus dipping an activated iron or nickel foil in a 30% aqueous dispersion of colloidal silica, followed by removal and drying of the dipped foil, leaves a foil surface that more slowly generates pyrophoric heat. The heat dwell is made a few seconds longer and the peak temperature reached can be almost 100° F. lower. However when 10 to 90% of the silica in the dispersion is replaced by the triethanolamine chelate of diproproxy titanium, the pyrophoricity-blocking effect is much more pronounced. The heat dwell can then be extended about 40% while the peak temperature drops a little over 200° F. A mixture of about 2 parts silica and about 3 parts chelate, is preferred.

The foregoing chelate has the formula

Triethanolamine, diethanolamine or monoethanolamine can be mixed with the colloidal silica to give effects similar to those of the chelate, and colloidal alumina can be correspondingly substituted for the colloidal silica, as can colloidally-sized, i.e. submicron-sized, particles of other inert solids.

The leaching after compacting and sintering to make pyrophoric masses, is particularly desirable for the making of masses such as discs or ribbons whose pyrophoric action is desired to have a long duration. This is illustrated in Example 5.

EXAMPLE 5

A mixture of carbonyl iron powder with an equal weight of fine aluminum powder is pressed together and sintered as described in U.S. Pat. No. 3,379,635 to form a disc about 50 mils thick. The disc is then leached with hot 30% NaOH solution overnight to yield a pyrophoric porous article which when exposed to air generates heat for about two minutes.

The maximum temperature developed at the disc's surface is only about 1400° F., but this temperature can be increased by impregnating the porous disc with material that is rendered exothermic by the pyrophoricity. Thus an aqueous suspension of micron-sized powdered zirconium can be poured on the porous disc to cause the fine zirconium particles to lodge within the disc's pores. On drying the pyrophoric heat generation ignites the zirconium so that the mixture temperature of the disc's surface goes well above 1400° F.

Powdered boron is a very effective heat generator but ignites at a temperature higher than zirconium does. Impregnating the foregoing porous disc with a mixture of 5 weight % zirconium and 5 weight % boron, based on the weight of the unimpregnated disc, yields a very effective pyrophoric combination however, in which both the zirconium and the boron burn upon exposing the impregnated disc to air.

A feature of Example 5 is that the pyrophoric product made, whether or not impregnated, is very inexpensive to prepare. The total cost of the ingredients is quite small, and the compacting and sintering steps are not expensive. No diffusion coating is needed and the sintering can be completed in as little as 30 minutes. An inert or reducing atmosphere is preferably used for the sintering.

Nickel powder can be substituted for the iron powder in the compacts, but is preferably mixed with 1½ times its weight of aluminum powder. A 50-mil thick disc press-sintered from such a mixture and then leached 14 hours with hot 20% aqueous NaOH is more pyrophoric than the leached iron-aluminum disc of Example 5, but its pyrophoricity does not last as long. Such a leached nickel-aluminum disc can have its pores impregnated with inert particles such as the alumina and silica mentioned supra, to stretch out its pyrophoric heat output. On the other hand it can be impregnated with heat-generating materials to further accentuate its high heat output. It will for example ignite micron-sized boron particles without the need for the low-ignition-temperature zirconium.

The press-sintered masses can be made thicker or thinner than 50 mils. Making them 10 mils thick for example, makes them sufficiently light in weight so that they will fall through the air relatively slowly, particularly if the discs are 1½ inches or more in diameter. A group of such discs can then be discharged in the air to act as an effective decoy for heat-seeking missiles. Their effectiveness as a radar decoy is improved if the discs are given a plating of copper or silver on one or both faces. Not more than about 0.1 mil of such plating is needed. Electroplating is preferred over electroless plating.

The pyrophorically-active discs also have good catalytic properties. For catalytic use it is generally safer to first eliminate the pyrophoricity, as by treatment with $H_2O_2$ and water as described in Ser. No. 359,212. An active platinum disc made by the press-sintering technique is also a very good catalyst after leaching, but eliminating its pyrophoricity is best effected by contacting it with dilute hydrochloric acid or other mineral acid. Catalytic platinum prepared this way has the added advantage that its content of contaminants such as carbon or iron can be kept extremely low. When preparing such catalytic platinum with an aluminum-diffusion step, the diffusion retort used to contain the diffusion materials tends to diffuse some of its constituents into the platinum. Carbon is thus frequently found in platinum that has been given a diffusion treatment in a steel retort. The use of a diffusion-coating retort made of nickel containing less than 0.1% carbon, does prevent such carbon contamination.

Figure 1:
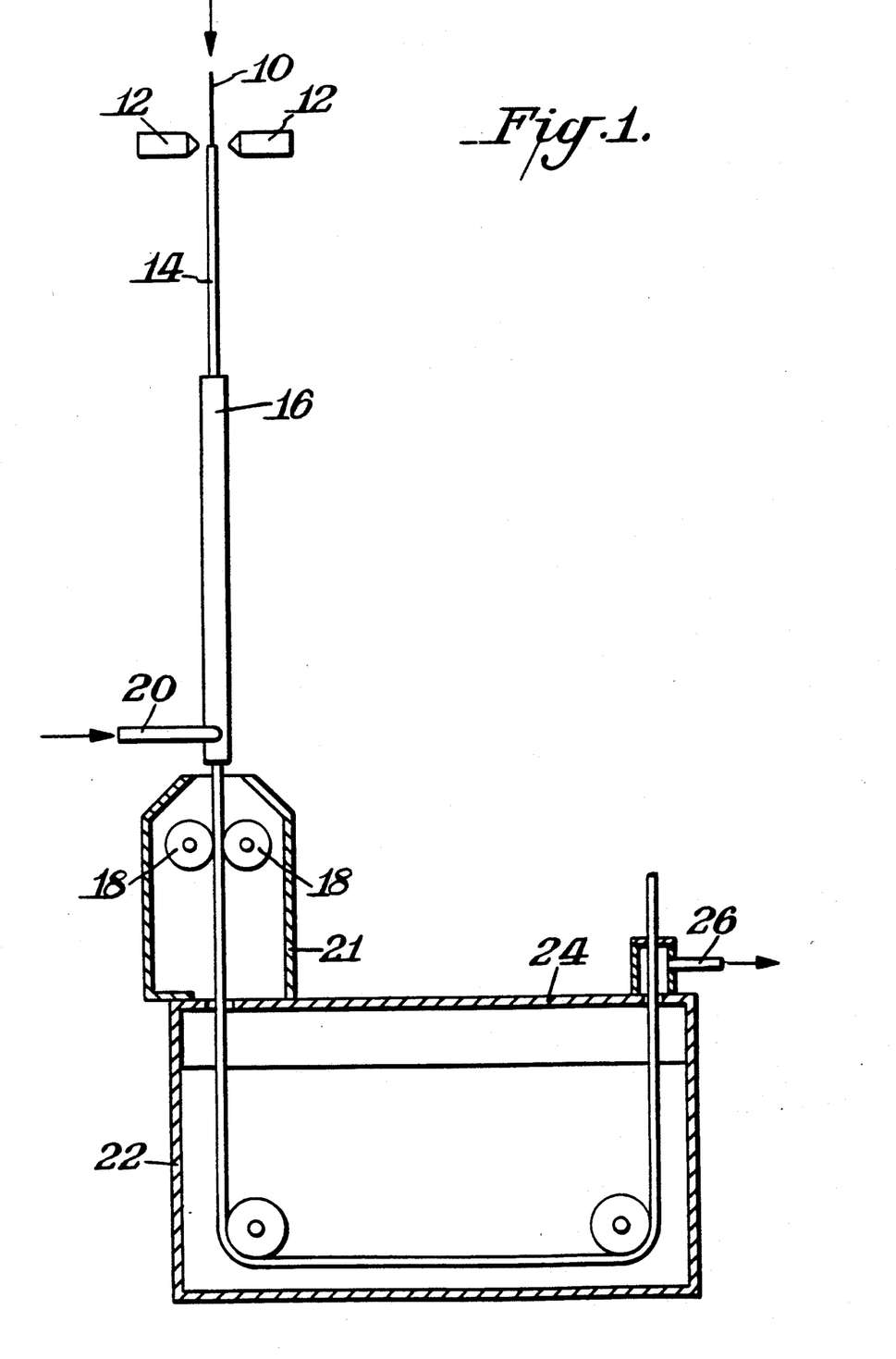
FIG. 1 is a somewhat diagrammatic illustration of an activating treatment according to the present invention and FIG. 2 is a vertical section view of a treating set-up pursuant to the present invention.

Instead of having the pyrophoric material in the form of a sintered disc, it can be prepared as a coating on a thin carrier web, as described in parent Ser. Nos. 205,387 and 182,718. FIG. 1 illustrates this modification.

In FIG. 1, a carrier foil 10 of stainless steel of 1010 steel about 1/40 to about 1/20 millimeter thick is spray coated on both its faces from spray nozzles 12,12 with a binder-containing mixture of iron powder and aluminum powder in a proportion that makes a Raney type alloy. The binder is a resin, preferably an acrylate, dissolved in a solvent like methyl chloroform. The powder particles are preferably no larger than about 5 to 20 microns.

The thus coated web 14 is led through an externally fired tube 16 of a tube furnace where it is rapidly heated to over 500° C. By that time the coating layers have been dried, the resin binder volatilized off, and the metal powders have interreacted to form the Raney alloy, $FeAl_3$ for example. After leaving the tube furnace but before the coatings have cooled excessively, the coated web 14 is passed between reduction rolls 18,18 where the hot Raney alloy is compacted to essentially eliminate voids.

A protective gas such as argon is preferably introduced, as at 20, into the furnace tuber 16. Some of that gas will rise in tube 16 and thus protect the coated web from the oxidizing action of the ambient air as it heats up. Portions of the gas will also flow down from the exit end of tube 16 and similarly protect the hot emerging web. A cylindrical shell 21 may be positioned about the emerging web to help fine the downwardly-flowing protective gases against the hot web.

The reduction rolls 18,18 should be sufficiently massive so that they are not excessively heated by the hot web. If desired, the rolls can be liquid cooled to help hold down their surface temperature.

The compacted web is then led through a tank 22 containing aqueous caustic soda which dissolves much of the aluminum from the Raney particles on the web. The trip through the caustic soda is preferably arranged to take two to 10 minutes, as by adjusting the temperature and concentration of the caustic. The web entering the caustic can be as hot as 600° C. and the action of the caustic generates heat, so it is simpler to keep the caustic solution hot, at least about 80° C.

The caustic generates large quantities of hydrogen as it acts on the web, so that a hood 24 can be placed over tank 22, with a suction connection 26 to an aspirator that aspirates off the evolved hydrogen. The web emerging from tank 22 is wet with the caustic, and that caustic should be replaced.

As described in the parent application Ser. Nos. 182,718, 205,387 and 289,595, the proportions of iron powder to aluminum powder can be varied, nickel powder can be substituted for some or all of the iron powder, and iron or nickel aluminides mixed with the incoming powders. The aluminide formation can be effected in stages as also described in those parents. The presence of a little copper in the sprayed-on coating mixture helps the aluminide coating adhere to a stainless steel web core. Instead of spraying the coating on the web, the web can be dipped in a coating bath, or applied to any other technique. The amount of coating should be such as to leave a compacted web not over about 1/5 millimeter thick.

When the coating layers contain iron aluminide, the caustic solution preferably contains a little dissolved tin, as described in the parent applications. Also as described in the parent applications, a little hydrogen peroxide can also be added to the caustic solution. Potassium hydroxide can be substituted for all or part of the sodium hydroxide.

The aluminide forming reaction in tube 16 is generally completed in a matter of seconds, so that the web can be passed through the furnace at a rate of about 3 meters per minute, and the furnace tube need be no longer than about 30 or 40 centimeters.

The above-described roll compacting carried out while the web is hot, at least 500° C., is more effective than on a colder web, and only requires a compacting force of about 30 kilograms per centimeter width of the web. Compacting can also be effected on the leached web, that is the web leaving the caustic solution, but is not as effective. The aluminide particles on the leached web are softer than those on the unleached web when the webs are at room temperature, but heating a pyrophoric leached web in an attempt to soften the leached particles, adversely affects their pyrophoricity. The greater the compaction, the more pyrophoric strips can be packed into a decoy shell used against heat-seeking missiles.

Diffusion coating has the advantage of being readily confined by masking, to specific areas of a substrate. This is illustrated in detail in the parent applications such as Ser. No. 242,350 filed March 19, 1981, and can be effected with the diffusion coating of platinum on superalloy airfoils of jet engines. Thus as shown in U.S. Pat. No. 4,041,196, platinum plating on the airfoil surface of nickel-base superalloy blades for the hot section of a jet engine, improves the life of the blades, particularly when the platinum plated airfoils are then given a diffusion aluminizing or chromaluminizing. The above-noted MCrAlY and MCrAlZr coatings also greatly improve such life. By masking the roots of the blades, these coatings can be kept from the roots, where they are not needed and where they can increase dimensions out of tolerance.

Some blades however are made of hafnium-containing superalloy, for example Rene 80, and do not accept aluminum or MCrAlY or MCrAlZr coatings well unless the surface being aluminized is treated to deplete its hafnium content. To this end the blades can be given a heat treatment with their airfoil surfaces packed in a mixture of powdered nickel and inert refractory diluent like alumina. Only about 10% nickel by weight in such a pack will be enough to adequately deplete the airfoil surface at 1200° F. for about one hour in a diffusion coating atmosphere such as one provided by the decomposition of $NH_4Cl$ or other diffusion coating energizer.

The foregoing depletion can be quite pervasive, and is undesirable if it extends to the blade root where maximum strength is needed. The root is accordingly packed in a separate masking mixture such as the high-chromium masking powders of U.S. Pat. No. 3,801,357. A typical formulation for this purpose is a mixture of powdered $Ni_3Al$ with powdered chromium and powdered inert refractory diluent, in which the chromium content is about 3 to about 10 weight %, and the diluent content is about ¼ to about ⅔ by weight. The $Ni_3Al$ can be replaced by nickel aluminides having more than one-third and up to three-fourths atom of aluminum for every atom of nickel. The chromium content should be not over 15%, and the nickel aluminides can be omitted.

The temperatures at which such masking is effective are the same temperatures at which the airfoil depletion is effected, and can vary from about 1000° F. to about 2000° F. Inasmuch as very little depletion is needed, the depletion treatment is preferably kept short —not longer than about 2 hours at the masking temperature. Even ½ hour of depletion treatment improves subsequent coatings including aluminizing whether of the complex kind that uses a pack containing both chromium and aluminum powders or the simple pack treatment in which there is no significant amount of chromium in the pack, or whether the aluminizing is conducted in the gas phase as described in U.S. Pat. No. 4,347,267. Apparatus suitable for the masking of the present invention is shown in U.S. Pat. No. 3,801,317.

The Rene 80 alloy is a nickel-base superalloy, and cobalt-base superalloys can also contain hafnium and require surface depletion. The depletion treatment for cobalt-base superalloys can be exactly the same as for nickel-base alloys, including the use of the above-noted root-masking technique. However for the cobalt-base superalloys, cobalt aluminides can also be substituted for the corresponding nickel aluminides in the root-masking compositions. The root-masking compositions can also contain a very small amount of hafnium —about ¼ to ½% by weight —to improve their masking effects.

MCrAlY and MCrAlZr coatings are generally applied by holding the workpieces in an evacuated chamber into which the coating ingredients are plasma sprayed. It is accordingly helpful to have the workpieces pre-masked as by embedding the portion to be masked —the root of a jet engine blade for example —in a masking powder, or by applying to that portion an adherent masking mixture. A very effective masking for this purpose is made of two superposed coating layers, the lower layer being a nickel aluminide layer as described in U.S. Pat. No. 3,801,357, and the upper layer being a thin coat of powdered nickel with or without a little powdered aluminum. The aluminide of the lower layer has less than one atom of aluminum for each atom of nickel, and can also contain a little chromium as described in U.S. Pat. No. 3,801,357. The aluminum powder in the upper layer should provide not more than one atom of aluminum for every three atoms of nickel in the upper layer.

The lower layer preferably has a thickness of about two to 10 mils, and the upper layer about 3 to 8 mils. In such a masking combination the lower layer prevents depletion from the workpiece portion it covers, and the upper layer forms an adherent protective sheath as the plasma spray operation starts, thus anchoring both layers in place during the entire MCrAlY or MCrAlZr coating sequence. A little inert refractory powder such as alumina or mixed iron-zirconium-silicon oxides, can be mixed with the nickel powder of the upper layer, preferably not over 10% by weight of the nickel.

After heavy use in jet engines, the coated cobalt-base and nickel-base superalloy parts will generally require recoating and/or repairs.

Repairing or re-coating is, in the present state of the art, impossible to effect properly unless the component has its surface thoroughly cleaned and de-oxidized. Fluoridizing bright anneal treatments for this purpose are described in parent application Ser. No. 757,606, in U.S. Pat. Nos. 2,561,565, 2,561,566, 2,585,819, 2,851,387, 3,713,206 and 4,098,450, 4,188,237, 4,234,594, 4,328,044 and 4,405,379, as well as the paper in The Welding Journal issue of November 1977, pp. 15-22, and the paper by E. Genieys entitled "Brazing in reducing fluoride-containing atmospheres" delivered at the British Association for Brazing and Soldering, First International Brazing and Soldering Conference held November 27-29, 1972.

Figure 2:
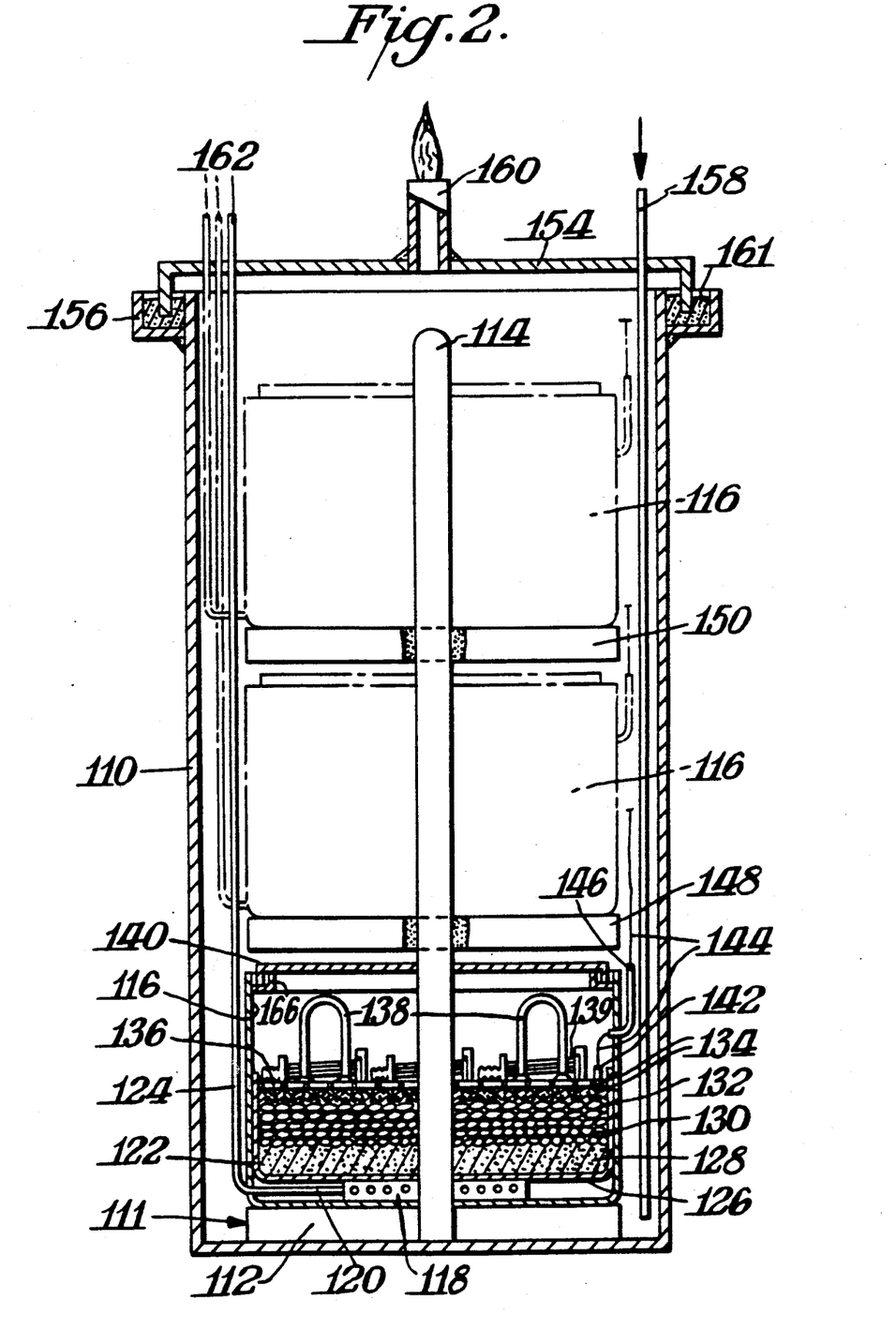

FIG. 2 illustrates a technique for effecting a fluoridizing bright anneal treatment that does a very good job of cleaning and deoxidizing such an engine part.

The set-up of FIG. 2 uses an Inconel 600 outer retort 110, a rack 111 with lifting arms 114 carrying a bottom ring 112 being lowered into the outer retort. An inner retort 116 rests on ring 112, and on the floor of the inner retort is a sparger box 118 connected by tube 120 to an outer connection 122 for a gas supply conduit 124. On box 118 is placed a basket 126 which holds the fluoridizing reactants. The floor of the basket is barely covered with a layer 128 of about 325 mesh chromium powder about ½ millimeter deep. Over this layer is poured in a 2-millimeter deep layer 130 of the following mixture:

| | |
|---|---|
| powdered NH$_4$HF$_2$ | 86% by weight |
| powdered CrF$_2$ | 12% by weight |
| powdered chromium | 2% by weight |

On top of layer /30 there is applied a ½-centimeter deep layer /32 of chromium granules about 5 to about 20 millimeters in size, and this is then covered with two 60 by 60 mesh screens /34 made of nickel wire 4 to 20 mils thick over which a nickel or Inconel-600 rod grid /36 is placed. The grid has handles /38 for convenient handling. Nickel-base superalloy blades that have been used in an engine and need overhaul, as at /39, are examples of components that can be placed directly on the grid /36 and can be piled up to depths of up to about six inches. If desired, an additional nickel screen can be placed over the floor of the grid to help keep small blades from slipping through the grid. The inner retort as so loaded is loosely covered with a lid /40. One or more thermocouples /42 can be placed among the blades to check the temperatures to which they are subjected, and thermocouple leads /44 can be run through a tubular port /46 to outside the inner retort.

Rack 112 has additional rings 148 and 150 to hold additional inner retorts that can be packed like retort 116 before the rack, fully or partly loaded, is lowered into the outer retort 110. A cover 154 is then fitted into a trough seal 156 at the top of the outer retort, cover 154 carrying an inlet tube 158 which reaches down into the very bottom of the outer retort, and also carries one or more discharge tubes 160. Additional passageways 162 are provided for the sparger and the thermocouple leads for each inner retort. Finely divided alumina powder is poured into trough seal 156 to block passage through the seal. There is no reason to internally block access to the inner retorts, so where they also have trough seals as at 166 the troughs of those seals are preferably kept empty. Aside from the nickel screens and possibly the nickel grid, all parts are preferably made of Inconel-600 or Incoloy-800.

The bright anneal treatment is carried out on used diffusion-aluminized blades which have been subjected to a cleaning as by wire-brushing and grit blasting to remove accumulations such as visible oxides and the like, which deposit during engine use. After the retorts are loaded as set out above, a shell furnace is placed around the outer retort and started up to apply heat, and a stream of argon is fed in through tubes 158 and 162. After the thermocouples reach about 300° F. and the argon has flushed out the air from the retort assembly, a stream of hydrogen is substituted for the argon, and the hydrogen flow held down to about one cubic foot per hour in each inner retort, and about twelve cubic feet per hour through the outer retort. A flame can be applied to the vent 160 to burn off escaping hydrogen.

The thermocouples will reach 1700° F. after several hours, and the furnace heating then controlled to keep the thermocouples between about 1700° F. and 1750° F. for twelve hours. The heating is then stopped and the retorts permitted to cool. The furnace can be removed from around the outer retort to speed the cooling.

When the thermocouples fall to about 300° F., the hydrogen stream is replaced by an argon stream to flush out the hydrogen before the retorts are opened and the blades removed. The flushing can be speeded to increase its cooling effect. The removed blades have a frosty appearance and show essentially no surface aluminum, even when the blades are air-cooled hollow blades that had previously been aluminized inside and outside. Indeed, originally diffused-in aluminum is apparently all gone but the blade's dimensions are substantially unchanged so that hollow blades with very small wall thicknesses can be re-used more often. Stripping off of the prior aluminized case as by the process of U.S. Pat. No. 4,327,134 generally leaves the blade with about ½ to one mil of its surface removed, as compared to the blade before the original aluminizing. Hollow blades aluminized inside and out and then stripped inside and out, suffer such surface removal both inside and out.

It should also be noted that the nickel-base superalloys such as B-1900, IN-713, IN-600 IN-738 and Hastelloy X, from which such blades are made, are not deleteriously affected by the hot fluoridizing treatment if the maximum temperature is not higher than about 1775° F. At higher temperatures some intergranular attack tends to occur when these alloys contain at least about ¼% aluminum, titanium, tantalum or similar metal. At temperatures below 1700° F., the time of treatment is lengthened, and below about 1650° F. the time required is too long to be practical.

After the fluoridizing treatment of the present invention, the blades are ready for re-aluminizing, preferably by pack diffusion in a powder pack of a mixture of:

| | |
|---|---|
| powdered aluminum-silicon alloy (88:12 aluminum to silicon by weight) | 20% by weight |
| powdered alumina | 80% by weight | with ½% powdered NH$_4$Cl added by weight of that mixture. A six-hour treatment at about 1400° F. is very effective, followed by post diffusion at 1975° F. for 4½ hours in hydrogen, and then, if desired, aging at 1650° F. for ten hours in hydrogen or argon. Such aging is desirable for some alloys such as B-1900.

Aluminizing as in U.S. Pat. No. 3,801,357 is also suitable.

Where the fluoridized blade has narrow cooling passageways, the re-aluminized is best carried out by the process described in U.S. Pat. No. 4,347,267. Different parts of the blade can be aluminized by different techniques so that, for example, the interiors of hollow blades can be aluminized by the slurry technique of U.S. Pat. No. 4,347,267, while their exteriors are aluminized by a gas aluminizing.

Other nickel-base, as well as cobalt-base jet engine parts such as vanes and combustion chambers, are also well suited for the foregoing re-conditioning treatment.

The fluoridizing action is essentially, an exposure to an atmosphere containing a low concentration of hydrogen fluoride, and any other means for supplying hydrogen fluoride at a concentration of about ¼% to about ½% by volume in hydrogen can be used as described in the above-cited prior art. Where the fluoridizing atmosphere is developed by decomposing NH₄HF₂ or other materials contained in the retorts, that atmosphere is best not flushed out too rapidly during the cleaning stage, as by keeping the hydrogen flow in the inner retorts down to not over about 1% of the space in the inner retort, every minute.

While any such low-level HF atmosphere can do the job, it is preferable to generate such atmosphere with the help of metallic chromium and hydrogen. At the fluoridizing temperatures these materials undergo interaction with any HF present, to provide an automatic control of the HF concentration. Such control is improved by the additional presence of NH₄HF₂ or other material such as polytetrafluoroethylene that decomposes to generate HF. Chromium fluorides such as CrF₃ and/or CrF₂ can be added, but they also form gradually during the treatment. The additional presence of metallic nickel also helps control the HF content, particularly where the nickel is interposed between the substrates and the source of HF.

The flow of hydrogen can be further reduced or completely eliminated as by use of glass-sealed inner retorts such as through the technique described in U.S. Pat. No. 2,844,273. Send seals can also be used but do not make perfect seals. Care may be needed to keep the glass and sand of those seals from consuming too much HF.

The layer 128 can be eliminated from the inner retort 114, and the chromium fluoride eliminated from layer 130. It is important that the workpieces be spaced from the NH₄HF₂ and they are best separated by at least two nickel screens. The workpieces preferably have their least critical surfaces placed on the nickel screens. Thus, in the case of jet engine hot section blades, the blade roots take little or no aluminizing and are best located against those screens.

When carrying out the bright annealing in an outer retort having a capacity of about 190 liters or more, the content of chromium granules should be over 10,000 grams, preferably 15,000 to 60,000 grams or more. A hydrogen flow of about two standard cubic feet per hour is then quite suitable.

The quantity of ammonium bifluoride added to the retort need not be so large as to leave any over undecomposed when the heat is completed. About 900 grams for the 190-liter retort gives good results but as little as 300 grams is adequate.

On the other hand, when fluoridizing vanes or blades that have been previously stripped of their aluminide coatings, as by the techniques described in U.S. Pat. Nos. 3,622,391 and 4,327,134, best results are obtained when ammonium bifluoride and chromium are used as described above but no chromium fluoride is added in layer 130. The pre-stripped airfoils are more amenable to the fluoridizing, and the presence of any chromium fluoride is not helpful when working in volumes at least as large as about 100 liters.

Some chromium fluoride forms during the fluoridizing, but it volatilizes at the operating temperatures and little or none remains when the treatment is completed. The ammonium bifluoride is essentially consumed in each fluoridizing run, and the chromium powder particles sinter together and both are replaced for every run. Some chromium deposits on the airfoils and noticeably increases their surface chromium content. This increase is only about two to five percent when the airfoils are kept out of contact with the chromium powder and granules. Inasmuch as the superalloys contain substantial quantities of chromium, the small increase in the skin content does not detract from their physical characteristics and actually helps in the brazing. Moreover, it also improves the protection provided by the subsequent aluminizing inasmuch as the aluminized skin then contains more chromium than is normally present.

When the fluoridizing treatment is prolonged and at very high temperatures, e.g., 12 hours at 1800° F., there will be some depletion of alloying ingredients from the airfoil surface, particularly if that surface is kept in contact with nickel. Aluminum, titanium, tantalum, boron, vanadium, silicon and molybdenum are most likely to be depleted in this way, but depletion problems can be alleviated by keeping the fluoridizing temperature below 1800° F., e.g., not over 1785° F., or keeping the run time below eight hours or both. Further reduction in depletion is obtained by adding to the inner retorts some of the free metal, or fluoride of, titanium, tantalum or other metal for which depletion is not desired. Thus, an alloy can be prepared to contain all the metals for which depletion is to be avoided and a lump or large granules of such alloy placed in each inner retort on top of the chromium granules. By making the alloy granules at least about ¼ inch in size, they will only be gradually attacked by the hydrogen-fluoride-containing atmosphere.

The airfoils being fluoridized are nickel-or cobalt-or iron-base superalloys and are preferably kept out of contact with the solid ammonium bifluoride, and out of contact with the chromium. The fluoridizing conditions lend themselves to the diffusion of one metal into another, and to be on the safe side, the only metals brought into contact with them are nickel or alloys containing at least about 70% nickel.

After one or two runs with such a separate quantity of depletion-inhibiting alloy granules, the chromium granules become diffusion-coated with the depletion-inhibiting metals. For the next few runs the separate depletion-inhibiting alloy is not necessary. Only about five grams of depletion-inhibiting metal is necessary in each inner retort, even where that retort is as large as 50 liters.

The amount of chromium powder can be increased so its weight is equal to or even exceeds the weight of the ammonium bifluoride. On the other hand, the ammonium bifluoride can be partly or completely replaced by ammonium fluoride, taking into consideration the fact that ammonium bifluoride generates about 40% more hydrogen fluoride than an equal weight of ammonium fluoride does.

A particularly effective fluoridizing of nickel-base vanes uses the setup of FIG. 2 with the outer retort 110 having a volume of about 190 liters, closed by a water-cooled cover 154 fitted essentially gas-tight which is without the sand seal 156, 161, and using a mixture of:
300 grams ammonium bifluoride, and
375 grams powdered chromium 300 mesh
or separate layers of each material, in place of layers 128 and 130. Set up in this way, a 6-hour heat at 1775° F. to 1785° F. produces highly desirable results.

In general, the combined powder layers 128 plus 130 should total about 2 to about 4 millimeters in thickness and their ammonium bifluoride content between about 25% and about 70% by weight. The chromium powder should be at least about one millimeter thick if in a separate layer.

The fluoridizing will be fully effective if the chromium powder is not used, but then where is little or no chromium enrichment of the airfoil surfaces. Enrichment becomes noticeable when the chromium powder particles are 100 mesh in size or smaller.

Cobalt-base superalloy workpieces, when fluoridized and re-aluminized by the foregoing techniques can be fluoridized at temperatures which can range to as high as 2,000° F., inasmuch as they are not as susceptible to intergranular attack.

Where desired, the exhaust gases discharging from the fluoridizing set-up of FIG. 2 can be scrubbed before they are burned to reduce their fluoride content. A wet or dry scrubbing can be used.

The bright anneal treatment described above can also be practiced on blades that have a thermal barrier coating such as the yttria-stabilized $ZrO_2$ described in NASA Technical Memorandum 73792 published in 1978 and authored by Stanley R. Levine, and the MgO-stabilized $ZrO_2$ described in Westinghouse Electric Corporation Report No. CR-165545 dated July 1982 under NASA Contract NAS3-21377. Those barrier coatings are thoroughly decomposed by the bright anneal of the present invention, and may leave residues that can be easily brushed or blasted away to expose bright fluoridized superalloy surface ready for repair and/or re-coating. Calcium silicate barriers also described in the last-mentioned report are likewise decomposed and removed.

Where the thermal barriers have been applied over NiCrAlY coatings as described in the last-named papers, the NiCrAlY coating is also attacked and depleted of its aluminum and yttrium content. The nickel and chromium of the resulting NiCrAlY residue can be dissolved off as with inhibited HCl, and because that residue is porous and very thin the acid attack can be readily terminated without significant attack on the substrate. A suitable inhibitor for the HCl is tolylthiourea in a concentration of about 0.004%.

The bright annealing of the present invention is particularly desirable inasmuch as it is effective for treatment of used jet engine hot section components that had been coated with any coating currently used.

Carbon and graphite articles can also be diffusion coated to protect them at high temperatures. Thus, as described on pages 64-68 in the November 1986 issue of Advanced Materials & Processes, carbon-carbon composites made by pyrolytically depositing graphite in a cloth woven from graphite fibers can be used to make parts such as re-entry nose cone shields, wing leading edges and rocket nozzles for space shuttles, but need protection against oxidation. According to the present invention these carbon-carbon composites are diffusion coated with hafnium, titanium, boron or other material that forms a carbide resistant to temperatures as high as 3000° C. Ordinary pack diffusion in a pack containing about 5% to about 20% of the hafnium or other diffusing material, the balance powdered inert diluent such as $Al_2O_3$, yields diffusion at 1800 Deg. F. to 2100 deg. F. for three to twenty hours under hydrogen or inert atmospheres, and the outermost carbon skin is thus converted to the carbide of the diffusing material. One-fourth to one percent of the usual ammonium chloride activator can be used as well as of other ammonium halides and free halogens or hydrogen halides. Chromium chloride and other metal chlorides can also be used but they deposit their metals in the diffusion coating and this may or may not be desired. Hafnium halides or double halides with alkali metals are suitable activators, as are alkali metal fluoborates.

In order to have the diffusion uniformly penetrate to a depth of one to two mils (25 to 50 microns), it is necessary to repeat at least once the pack diffusion treatment, using a fresh supply of activator each time. The remainder of the pack can be re-used. Each diffusion heat should be at least three hours long.

EXAMPLE 6

A powder diffusion pack is prepared containing by weight:
20% finely hafnium powder
79% aluminium oxide powder, and
1% ammonium chloride In this pack are embedded a specimen of carbon-carbon composite that had not been siliconized, along with a specimen which had been fabricated with silicon carbide fibers interspersed in a two-layer carbon-carbon composite. Diffusion is conducted in a hydrogen-bathed atmosphere at 2000° F. for seven hours. The specimens are then removed from the pack, the pack reformulated by adding 1% ammonium chloride to replace the ammonium chloride that had vaporized, the specimens re-embedded, and another seven hour heat conducted at 2000° F. under hydrogen.

The resulting specimens, when removed from the pack, shown a 3.6% pickup of hafnium for the unsiliconized specimen, and a 30.2% pickup for the specimen containing the silicon carbide. The depth of the diffusion penetration is about 20 microns for the unsiliconized specimen, and about twice that much for the other specimen. A third diffusion heat provides deeper penetration and greater pickup.

Diffusing multiple materials into the carbon-carbon substrate is also helpful, particularly when titanium or boron or both are thus diffused in along with hafnium. Such multiple diffusion are more readily controllable when performed in separate stages, but they can also be carried out in a single heat.

Where the carbon-carbon substrate is extremely non-porous, it can be made more receptive to diffusion coating by pre-treating it to increase its porosity. A short decarburizing treatment in wet hydrogen at 1600° F. is effective for this purpose. Without such pre-treatment, the diffusion coating is apt to be non-uniform unless repeated several times.

The final diffusion coated product, whether or not using a porosity-increasing pre-treatment, is best further protected as by a top coating of iridium or its very high melting alloys with osmium or rhenium. Such a top coating is readily applied as by electroplating or coating with the resinates or other decomposable compounds of these metals, followed by firing to decompose them and deposit the free metal. The following is an example:

EXAMPLE 7

The two specimens coated in Example 6 are electroplated by immersing them in an aqueous iridium bromide electroplating bath containing 5 grams per liter of iridium and 0.1 mol per liter of hydrogen bromide, and cathodically treating the specimens at a current density of 0.15 amperes per square decimeter at 75° C. to build up a 10-micron thickness or iridium plating.

Other top coatings can also be used.

Many modifications and variations of the present invention are possible in the light of the above teachings. It is, therefore, to be understood that within the scope of the appended claims the invention may be practiced otherwise than as specifically described.

I claim:

1. In the leaching of aluminum from aluminum-diffused nickel or iron with aqueous caustic, the improvement according to which the aqueous caustic also contains from about 0.1% to about 3% hydrogen peroxide by weight.

2. The leaching process of claim 1 in which iron is the metal leached, and the caustic further contains dissolved tin ions.

3. The leaching process of claim 2 in which, after the leaching, the leached metal is treated with weak acid to further increase its pyrophoric output.

4. The leaching process of claim 1 in which the metal leached is a foil between about 1 and about six mils thick and after the leaching the foil is folded to further increase its high temperature dwell at least about 60%.

5. In the process of preparing pyrophoric aluminide by preparing precursor aluminide on a supporting web, and then leaching those particles, the improvement according to which the particles on the web are compacted at a temperature above about 400° C. to essentially fill all voids.

6. The process for preparing pyrophoric iron by providing unmelted Raney type iron-aluminum alloy, and then leaching the alloy to dissolve out most of the aluminum and thus leave an activated iron.

7. The process of claim 6 in which the unmelted alloy is in the form of particles not over about 100 microns in size.

8. The process of claim 7 in which the unmelted alloy is provided by the low temperature diffusion aluminizing of iron particles.

9. The process of claim 6 in which the leaching is effected with an aqueous caustic containing dissolved tin.

* * * * *